(12) United States Patent
Sheppard

(10) Patent No.: US 11,794,467 B2
(45) Date of Patent: Oct. 24, 2023

(54) REINFORCED TENSIONING FRAME

(71) Applicant: ASMPT SMT SINGAPORE PTE. LTD., Singapore (SG)

(72) Inventor: Christopher Sheppard, Weymouth (GB)

(73) Assignee: ASMPT SMT SINGAPORE PTE. LTD., Singapore (SG)

(*) Notice: Subject to any disclaimer, the term of this patent is extended or adjusted under 35 U.S.C. 154(b) by 80 days.

(21) Appl. No.: 17/629,815

(22) PCT Filed: Aug. 12, 2020

(86) PCT No.: PCT/IB2020/057581
§ 371 (c)(1),
(2) Date: Jan. 25, 2022

(87) PCT Pub. No.: WO2021/038353
PCT Pub. Date: Mar. 4, 2021

(65) Prior Publication Data
US 2022/0410557 A1 Dec. 29, 2022

(30) Foreign Application Priority Data
Aug. 28, 2019 (GB) ..................... 1912330

(51) Int. Cl.
*B41F 15/34* (2006.01)
*B41F 15/36* (2006.01)
(Continued)

(52) U.S. Cl.
CPC ............. *B41F 15/36* (2013.01); *B41C 1/14* (2013.01); *B41M 1/12* (2013.01); *B41N 1/248* (2013.01);
(Continued)

(58) Field of Classification Search
CPC B41C 1/14; B41F 15/34; B41F 15/36; B41M 1/12; B41N 1/248; B41P 2215/10; B41P 2215/50; H05K 3/1225
See application file for complete search history.

(56) References Cited

U.S. PATENT DOCUMENTS

| 5,606,911 A | 3/1997 | Cane ............................. 101/127 |
| 5,606,912 A | 3/1997 | Cane ......................... 101/127.1 |

(Continued)

FOREIGN PATENT DOCUMENTS

| CN | 1902051 A | 1/2007 |
| CN | 104661823 A | 5/2015 |

(Continued)

OTHER PUBLICATIONS

International Search Report dated Nov. 16, 2020 in corresponding PCT International Application No. PCT/IB2020/057581.

(Continued)

*Primary Examiner* — Christopher E Mahoney
*Assistant Examiner* — Marissa Ferguson-Samreth
(74) *Attorney, Agent, or Firm* — OSTROLENK FABER LLP

(57) ABSTRACT

A tensioning frame for tensioning a printing screen comprises struts to reinforce the constituent beams. These may be provided either on a supplementary brace plate or integrally formed with the beam. A shaft may be used to retain engagement bodies within pockets formed in the beam.

20 Claims, 13 Drawing Sheets

(51) Int. Cl.
 B41C 1/14 (2006.01)
 B41M 1/12 (2006.01)
 B41N 1/24 (2006.01)
 H05K 3/12 (2006.01)

(52) U.S. Cl.
 CPC ........ *H05K 3/1225* (2013.01); *B41P 2215/10* (2013.01); *B41P 2215/50* (2013.01)

(56) References Cited

U.S. PATENT DOCUMENTS

| | | | |
|---|---|---|---|
| 5,941,171 A | 8/1999 | Fromm | 101/127.1 |
| 6,038,969 A | 3/2000 | Podlipec et al. | 101/127.1 |
| 6,067,903 A | 5/2000 | Williams | 101/127.1 |
| 6,289,804 B1 | 9/2001 | Williams | 101/127.1 |
| 9,162,437 B2 | 10/2015 | Willshere | |
| 9,358,774 B1 * | 6/2016 | Niswonger | B44D 3/185 |
| 11,420,435 B1 * | 8/2022 | Simionescu | H05K 3/1225 |
| 2010/0307353 A1 | 12/2010 | Willshere | 101/126 |
| 2017/0080738 A1 | 3/2017 | Bailey et al. | |

FOREIGN PATENT DOCUMENTS

| | | | | |
|---|---|---|---|---|
| EP | 2 205 441 A2 | 7/2010 | | |
| GB | 2407799 A | 5/2005 | | |
| GB | 2431899 A * | 5/2007 | ............. | B41F 15/36 |
| GB | 2455493 A | 6/2009 | | |
| GB | 2526536 A | 12/2015 | | |
| JP | 2012-505767 A | 3/2012 | | |
| WO | WO 03/093012 A1 | 11/2003 | | |
| WO | WO 2005/046994 A2 | 5/2005 | | |
| WO | WO 2007/091035 A1 | 8/2007 | | |
| WO | WO 2009/047012 A2 | 4/2009 | | |
| WO | WO-2013110685 A1 * | 8/2013 | ............. | B41F 15/36 |
| WO | WO 2015/177174 A2 | 11/2015 | | |
| WO | WO 2017/164493 A1 | 9/2017 | | |
| WO | WO 2017/188555 A1 | 11/2017 | | |
| WO | WO 2019/103284 A1 | 5/2019 | | |

OTHER PUBLICATIONS

Written Opinion dated Nov. 16, 2020 in corresponding PCT International Application No. PCT/IB2020/057581.

* cited by examiner

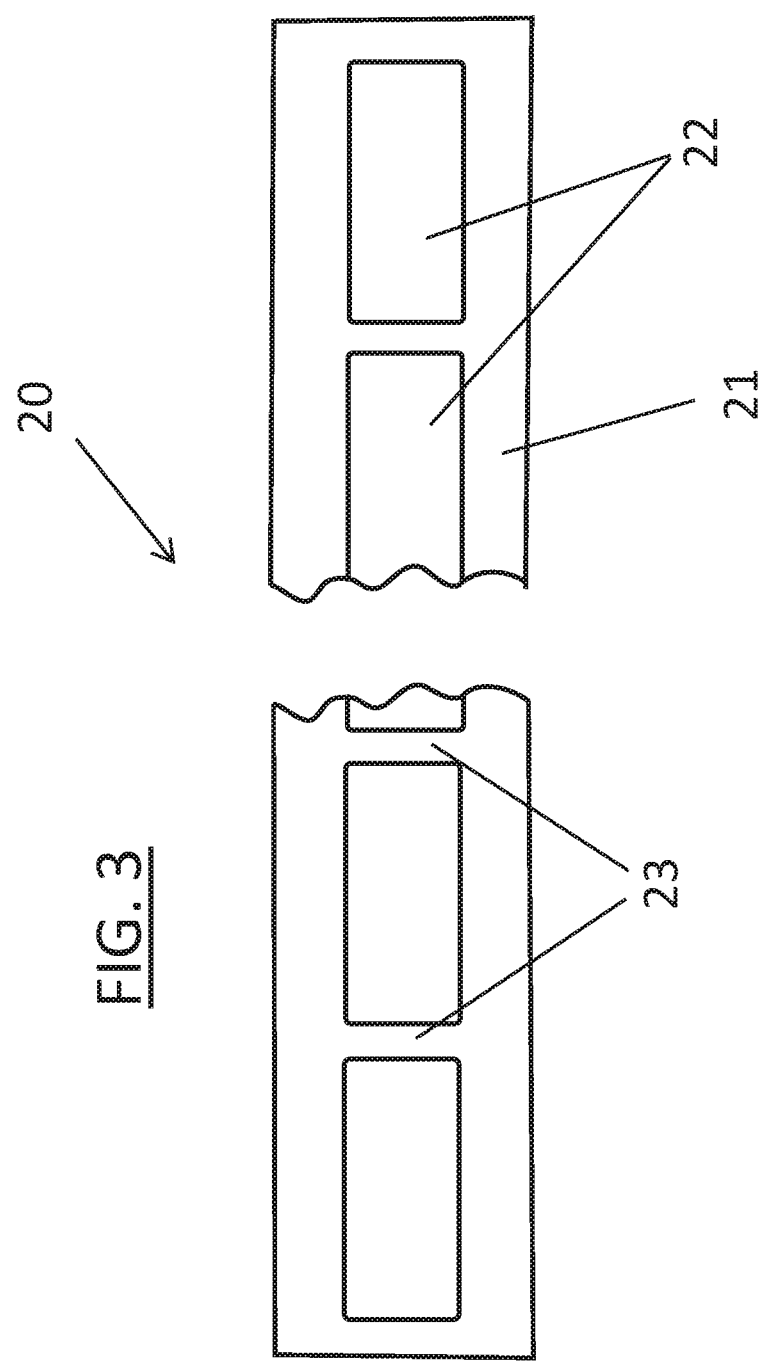

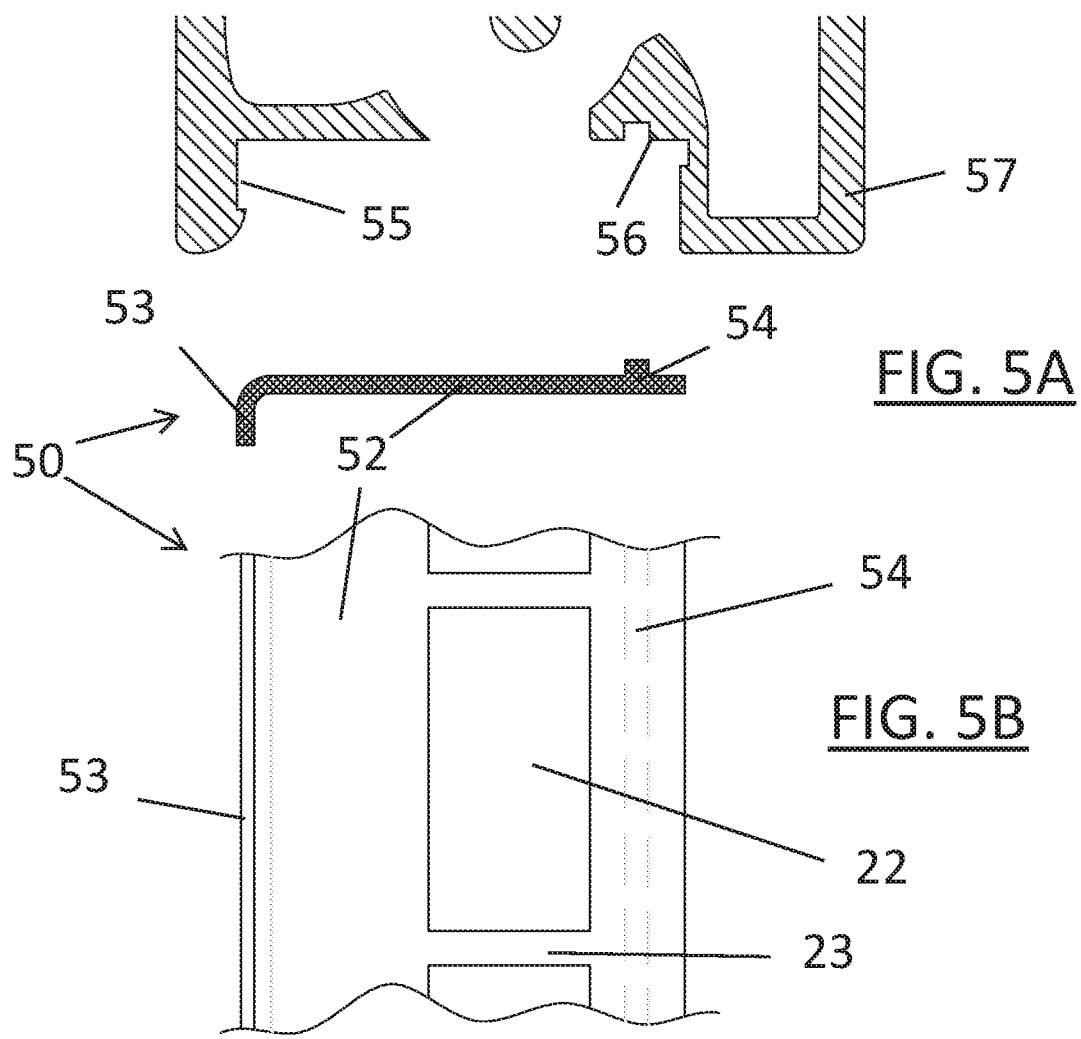
FIG. 5A
FIG. 5B
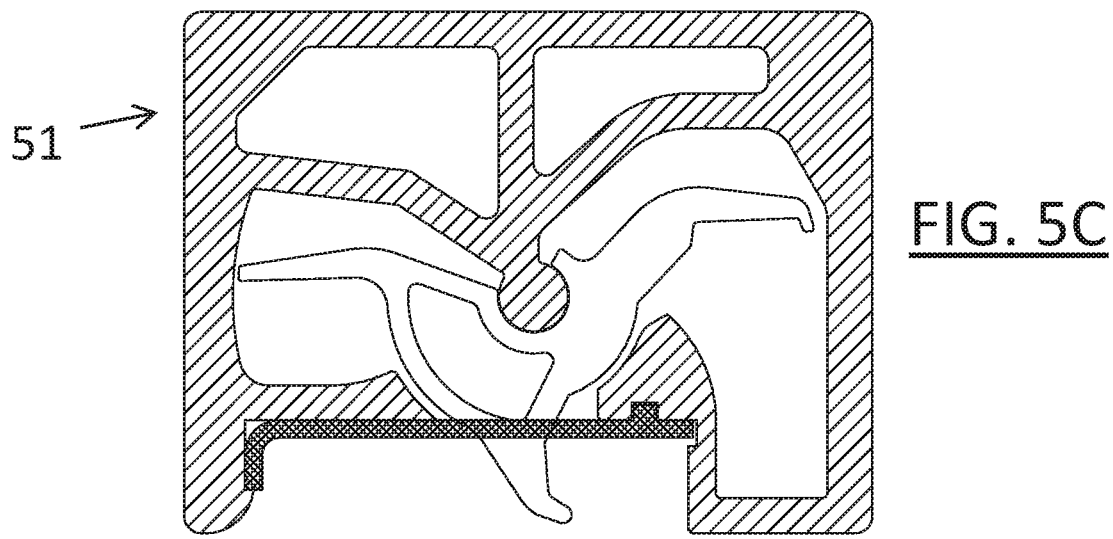
FIG. 5C

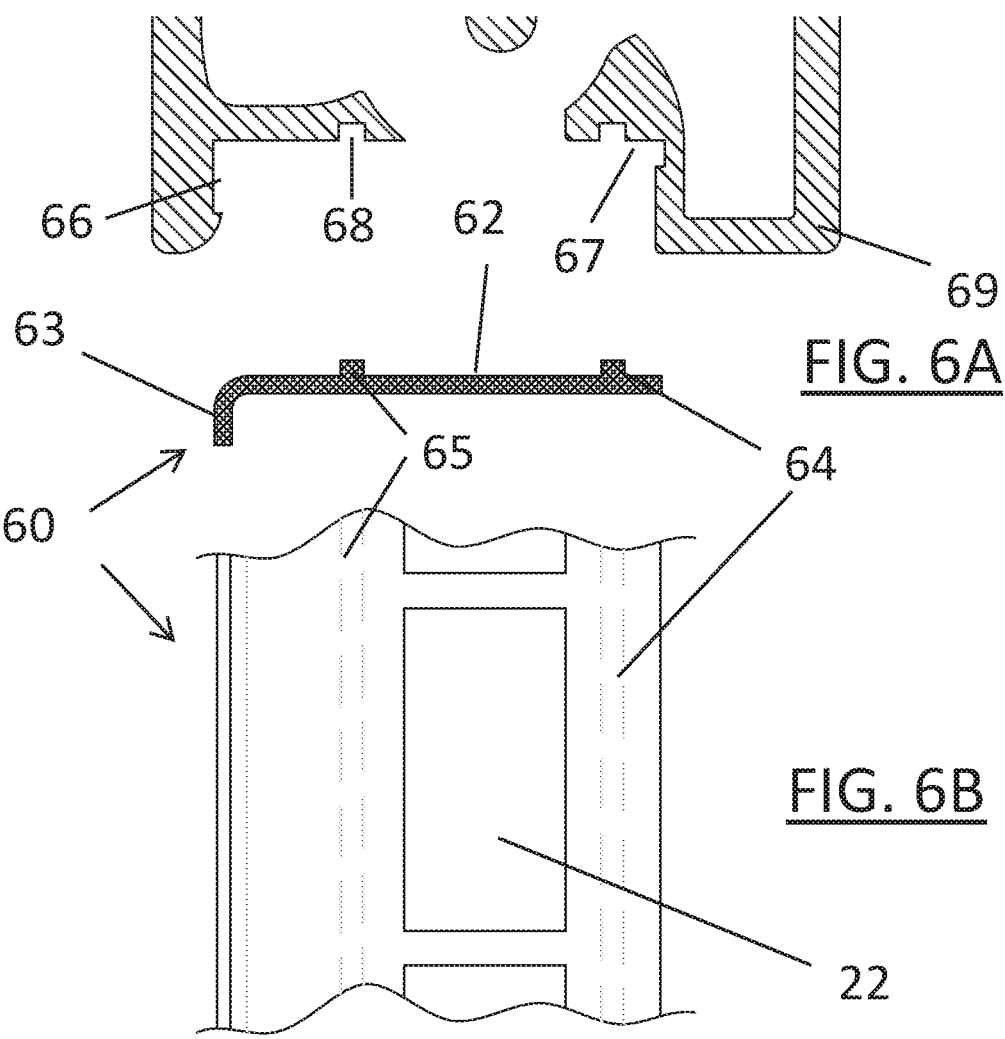
FIG. 6A
FIG. 6B
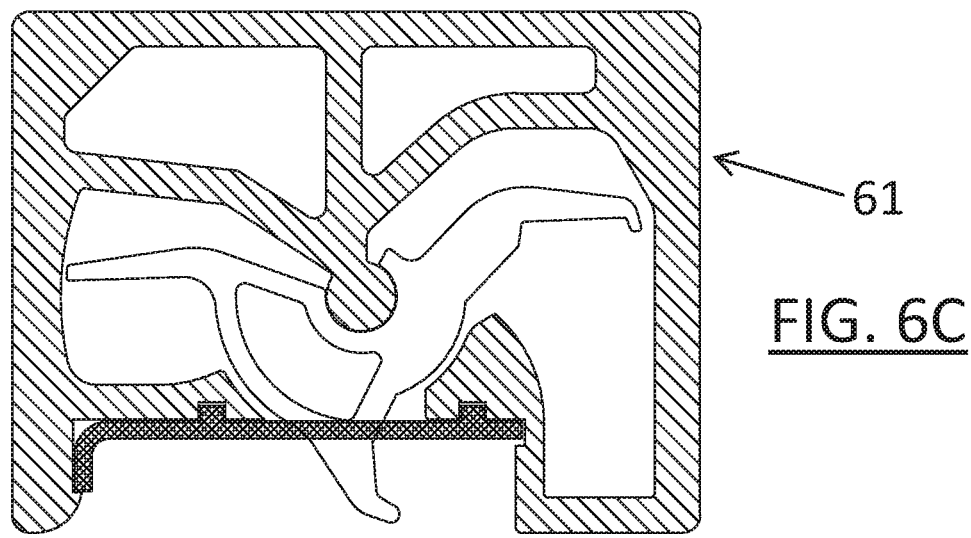
FIG. 6C

REINFORCED TENSIONING FRAME

CROSS-REFERENCE TO RELATED APPLICATIONS

The present application is a 35 U.S.C. §§ 371 national phase conversion of PCT/IB2020/057581, filed Aug. 12, 2020, which claims priority to United Kingdom Patent Application No. 1912330.6, filed Aug. 28, 2019, the contents of which are incorporated herein by reference. The PCT International Application was published in the English language.

This invention relates to a tensioning frame for tensioning a printing screen.

BACKGROUND AND PRIOR ART

Industrial screen-printing machines typically apply a conductive print medium, such as solder paste or conductive ink, onto a planar workpiece, such as a circuit board, by applying the conductive print medium through a pattern of apertures in a printing screen (sometimes referred to as a mask or stencil) using an angled blade or squeegee.

A printing screen is a substantially planar sheet which before use is cut to include apertures which define the pattern to be printed. In one common form it comprises a screen sheet formed of metal or plastics material, while in another common form comprises a mesh comprising a flexible, perforate sheet, for example a woven mesh of polypropylene or stainless-steel strands. In both forms it is necessary to hold the printing screen under tension during a printing operation, and conventionally this is achieved by removably attaching the printing screen to a rectangular tensioning frame. There are various such tensioning frames and methods for providing engagement between a printing screen and a tensioning frame, with one well-known example being the Vectorguard® system, which is described in WO-2003093012-A1, WO-2005046994-A2, WO-2007091035-A1, WO-2009047012-A2 and GB-2526536-A. Other systems are described in, for example, U.S. Pat. Nos. 5,606,911, 5,606,912, 5,941,171, 6,038,969, 6,067,903, 6,289,804, WO-2017164493-A1, WO-2017188555-A1, WO-2019103284-A1.

FIG. 1 schematically shows, in perspective view, the underside of a known Vectorguard tensioning frame 1, while FIG. 2 schematically shows a cross-section of a beam 2A of the Vectorguard tensioning frame in engagement with a printing screen 3. As can be seen from FIG. 1, the tensioning frame 1 is planar and defined by a plurality (here four) of elongate beams 2A-D which extend around the periphery of the tensioning frame 1, forming a rectangle, which in use may surround and tension a printing screen 3. The beams are identical in construction. Adjacent beams 2 are connected by corner pieces 4, one of which also includes a pneumatic port 6. Each beam includes a number of engagement surfaces 5, for engaging with a printing screen 3 in use. As can be seen in FIG. 1, the individual engagement surfaces 5 of each beam 2 are adjacent, and together form a composite engagement surface. With particular reference to FIG. 2, it can be seen that each beam (here beam 2A is shown) is hollow, comprising an elongate channel formed therein, the channel extending parallel to the length of the respective beam 2 and having an opening 6 at an engagement side (i.e. the underside) thereof, the engagement side of each beam 2 being co-planar and orientated parallel to the plane of the frame 1. The beam 2 is therefore approximately U-shaped in cross-section. Located within the channel is an engagement body 7 with three approximately radially-extending arms: a first arm 8 engages with a biasing member, here a spring 9, located between the arm 8 and an inner surface of the beam 2A; a second arm 10 which engages with a pneumatically inflatable tubing 11 located between the arm 10 and an inner surface of the beam 2A and which is connected to pneumatic port 13; and a third arm 12 carrying engagement surface 5. The engagement body 7 is mounted for rotation about a spindle 14 which is an integral part of the beam 2, with the rotation controlled by the inflation of tubing 11, acting against the bias of spring 9. The third arm 12 is sized so that the engagement surface 5 projects outwardly of the beam from the channel opening 6, during at least part of the engagement surface's range of travel during rotation of the engagement body. To tension a printing screen 3, the tubing 11 is first inflated to rotate the engagement body 7 clockwise as shown and thus move engagement surface 5 to the left as shown, and slightly retracted into the channel. A printing screen 3 having a patterned foil or mesh 15 and a supporting edging 16 is then positioned proximate the underside of the frame 1. Pneumatic pressure is then released from tubing 11, which deflates, allowing the engagement body 7 to rotate anticlockwise as shown under the biasing force of spring 9, so that the engagement surface 5 moves to the right as shown, and slightly outwardly, to engage with a corresponding profile of the edging 16, thus applying a tensioning force to the printing screen 3.

In practice, the Vectorguard tensioning frame is manufactured by forming each beam 2, and each engagement body 7, as metal extrusions. Each engagement body 7 may then be slid onto the spindle 14 from and end of the beam 2, and springs 9 and the tubing 11 are also inserted at one end of the beam and slid along to the intended position.

The Vectorguard system in particular provides simple, consistent and reliable operation, leading to its widespread uptake in the industry. However, since the Vectorguard system was introduced, there has been a general trend in the industry to increase the tension applied to printing screens via such tensioning frames, in an effort to yet further improve print performance, and it is envisaged that this trend will continue. Application of high tensioning forces, which could for example be around 50 N/cm or over, place correspondingly high mechanical stresses on the tensioning frames. While tensioning frames may be provided with suggested maximum operating tensioning forces, there is no guarantee that these guidelines will be adhered to in a production environment. There is therefore a risk that the tensioning frame could bend, distort or buckle if too great a tension is applied. Considering in particular FIG. 2, those skilled in the art will appreciate firstly that a generally U-shaped beam 2 will be most susceptible to deformation due to opening or closing of the channel opening 6, and secondly that the need to assemble the frame by sliding engagement bodies into a beam 2 from an end thereof prevents the inclusion of any reinforcement structures which could help to maintain the channel opening 6 at the intended size, since the channel must be kept open along its length.

The present invention seeks to overcome this problem by providing a mechanical solution offering greater structural integrity and the ability to withstand high operating tensions.

In accordance with the present invention this aim is achieved by a new configuration of tensioning frame, which permits the use of struts or cross-beams which increase the structural integrity of the tensioning frame. The applicability of this type of configuration is equally applicable both to tensioning frames with a rotary engagement body, i.e. an engagement body which rotates relative to a side of the tensioning frame, broadly similar to that of the original Vectorguard system, and those with linearly-movable engagement bodies which move linearly relative to a side of a tensioning frame.

SUMMARY OF THE INVENTION

In accordance with a first aspect of the present invention there is provided a tensioning frame for tensioning a printing screen, the tensioning frame being planar and comprising a plurality of elongate beams which extend around the periphery of the tensioning frame to define the tensioning frame, each beam comprising:

an engagement side arranged such that the engagement side of each beam is co-planar and orientated parallel to the plane of the tensioning frame, a beam body, an elongate channel formed within the beam body which extends parallel to the length of the beam and has an opening at the engagement side, an engagement body located within the channel carrying an engagement surface for engaging with a printing screen in use, the engagement surface being movable with respect to the beam body along a range of travel in a plane normal to the length of the beam, and an actuator operatively connected to the engagement body for moving the engagement body, and hence engagement surface, relative to the beam body, wherein at least one beam comprises at least one strut which spans the channel, so that the engagement surface projects outwardly of the beam from the opening of the channel and beyond the strut, during at least part of the engagement surface's range of travel.

In accordance with a second aspect of the present invention there is provided a tensioning frame for tensioning a printing screen, the tensioning frame being planar and comprising a plurality of elongate beams which extend around the periphery of the tensioning frame to define the tensioning frame, each beam comprising:

an engagement side arranged such that the engagement side of each beam is co-planar and orientated parallel to the plane of the tensioning frame, a beam body, an elongate channel formed within the beam body which extends parallel to the length of the respective beam and has an opening at the engagement side, an engagement body located within the channel carrying an engagement surface for engaging with a printing screen in use, the engagement surface being movable with respect to the beam body along a range of travel in a plane normal to the length of the beam, and an actuator operatively connected to the engagement body for moving the engagement body, and hence engagement surface, relative to the beam body, wherein the engagement body comprises a through-bore, and the beam comprises an elongate shaft which passes through both the beam body and the through-bore of the engagement body, to retain the engagement body within the elongate channel.

Other specific aspects and features of the present invention are set out in the accompanying claims.

The term "printing screen" used throughout this document is used generically to include both foil and mesh-type screens, whether or not provided with a pattern of printing apertures.

BRIEF DESCRIPTION OF THE DRAWINGS

The invention will now be described with reference to the accompanying drawings (not to scale), in which:

FIG. 3 schematically shows a brace plate from above in accordance with a first embodiment of the present invention;

FIG. 5A schematically shows a cross-sectional view of a brace plate and a lower part of a beam in an unmounted state;

FIG. 5B schematically shows a part of the brace plate of FIG. 5A from below;

FIG. 5C schematically shows a cross-sectional view of the brace plate and beam of FIG. 5A when in a mounted state;

FIG. 6A schematically shows a cross-sectional view of a brace plate and a lower part of a beam in an unmounted state;

FIG. 6B schematically shows a part of the brace plate of FIG. 6A from below;

FIG. 6C schematically shows a cross-sectional view of the brace plate and beam of FIG. 6A when in a mounted state;

Figure 1:
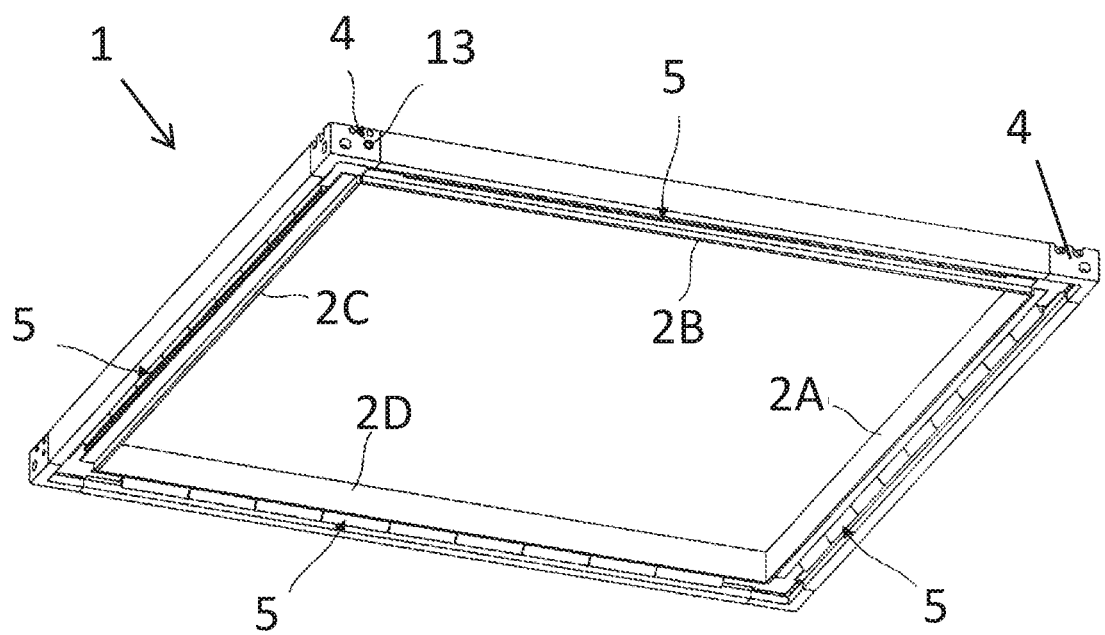
FIG. 1 schematically shows, in perspective view, the underside of a known tensioning frame.

Reference numerals are retained for similar features throughout the figures where possible.

DETAILED DESCRIPTION OF THE PREFERRED EMBODIMENTS OF THE INVENTION

In accordance with a first embodiment of the present invention, structural reinforcement of the tensioning frame is provided by the use of a separate reinforcement structure or "brace plate", which, by provision of locating adaptations on each beam body of a tensioning frame, may be fitted onto the beam bodies subsequent to the fitting of engagement bodies within their respective channels.

Figure 2:
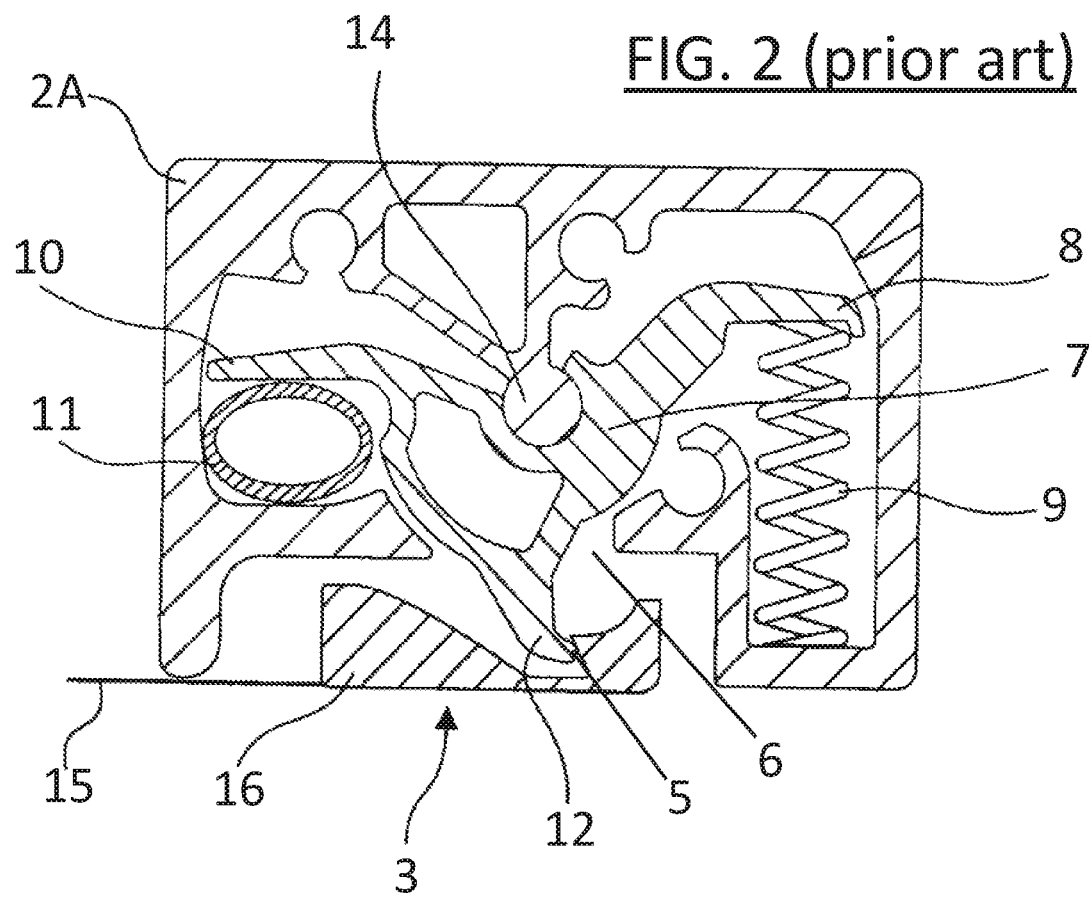
FIG. 2 schematically shows a cross-section of a beam of the tensioning frame of FIG. 1 in engagement with a printing screen.

FIG. 3 schematically shows such a brace plate 20 from above in accordance with a first embodiment of the present invention. The brace plate 20 shown is an integrally-formed layer 21 of rigid material, such as steel, aluminium or other metals, carbon fibre or other suitably robust man-made material. Preferably however, while the material will exhibit strong resistance to compression or expansion, it will have a sufficient ability to flex to enable it to be snap-fitted to a beam, as described in more detail below. Formed within the brace plate 20 is a linear array of apertures 22, for example by machining, laser-cutting or the like, which are dimensioned so as to receive an engagement surface of an engagement body (described in more detail below) such that it protrudes through a respective aperture 22 throughout the engagement surface's range of travel without impacting the brace plate 20. The number of apertures 22 formed will therefore depend on the size of the tensioning frame and number of retained engagement bodies in a beam. It should be noted that while in a preferred arrangement a single brace plate 20 will attach along the whole length of a beam, in other embodiments a plurality of brace plates 20 may be attached in line along a single beam. A plurality of struts 23 are formed within the brace plate 20, between and delimiting adjacent apertures 22. The brace plate 20 is adapted to fit to a beam adjacent the opening of its channel, and to enable this fitting, both the brace plate 20 and the beam are provided with complementary mechanical interfaces or profiles. Examples of such profiles, and the resulting fit between a brace plate and a rotary-style tensioning frame beam, i.e. where the engagement body is adapted for rotary motion in a similar manner as for the conventional Vectorguard system shown in FIGS. 1 and 2, are schematically shown in FIGS. 4 to 8.

Figure 4A:
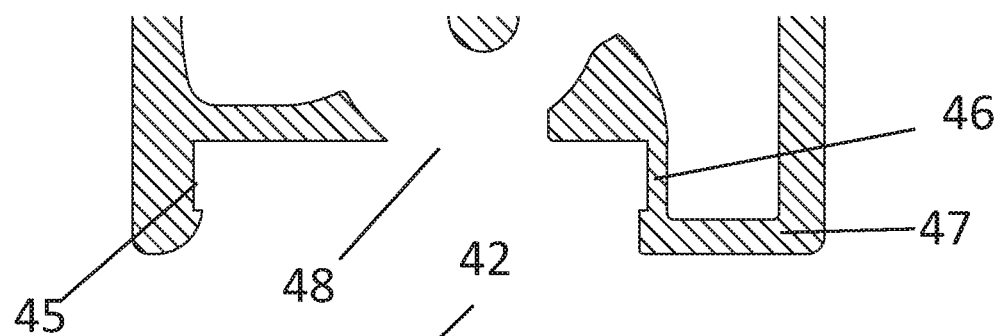
FIG. 4A schematically shows a cross-sectional view of a brace plate and a lower part of a beam in an unmounted state.
Figure 4B:
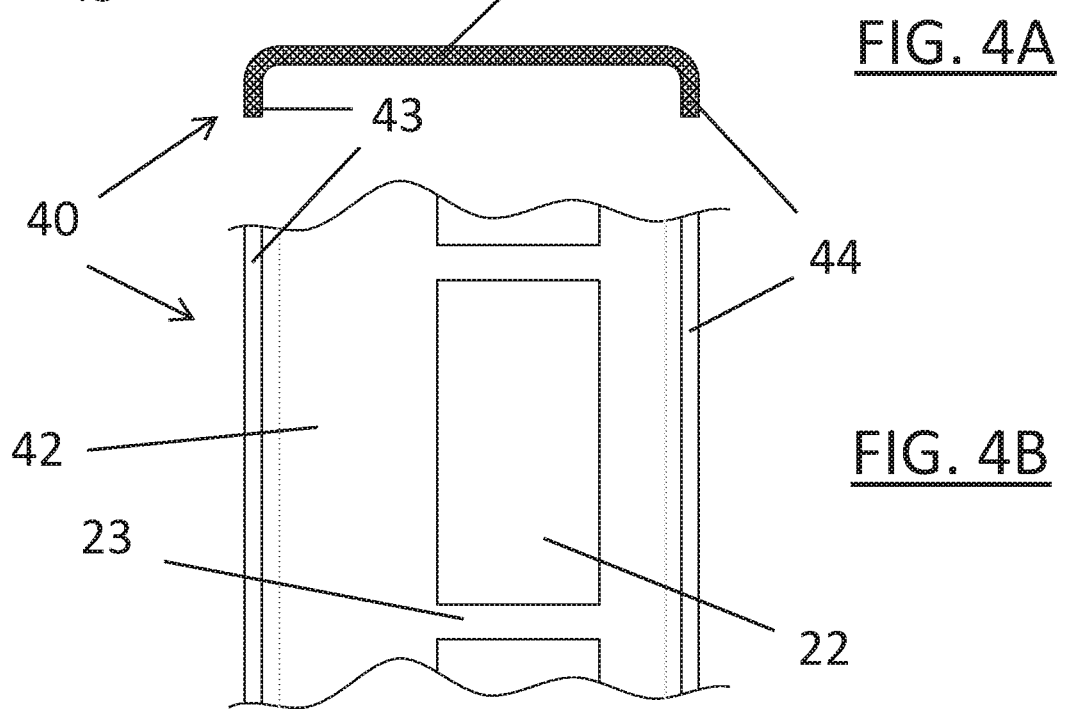
FIG. 4B schematically shows a part of the brace plate of FIG. 4A from below.
Figure 4C:
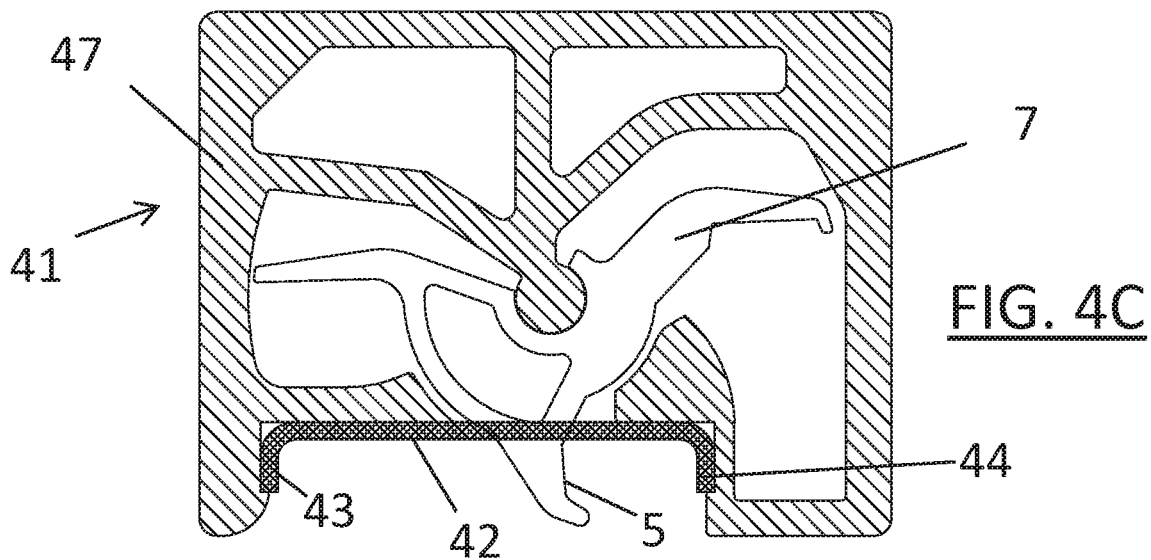
FIG. 4C schematically shows a cross-sectional view of the brace plate and beam of FIG. 4A when in a mounted state.

FIG. 4A schematically shows a cross-sectional view of a brace plate 40 and a lower part of an extruded beam body 47 of a beam 41 (see FIG. 4C) in an unmounted state. For clarity, internal components of the beam 41, such as the engagement bodies, are omitted from this figure. FIG. 4B schematically shows a part of brace plate 40 from below, i.e. the side of the brace plate 40 which is visible from the outside when it is fitted to beam body 47. FIG. 4C schematically shows a cross-sectional view of a beam 41 including its brace plate 40 in a mounted state. For clarity, certain internal components of the beam 41, such as springs and pneumatic tubing, are omitted from this figure. In this embodiment, the brace plate 40 comprises a main, planar body section 42, and first and second interfaces 43, 44 respectively located at opposite sides thereof, in the form of downwardly projecting folded edges perpendicular to the plane of the body section 42. The beam body 47 meanwhile is provided with complementary interfaces 45, 46, for engaging with interfaces 43, 44 respectively in use. Here, interfaces 45, 46 are formed as recesses in the beam body 47, dimensioned to receive and accommodate interfaces 43, 44 in use, so that the brace plate 40 covers beam opening 48. Apertures 22, separated by struts 23, permit the engagement surface 5 of a respective engagement body 7 to protrude therethrough throughout its range of rotary travel. Preferably, the brace plate 40 is capable of limited flexing, to ensure that the brace plate 40 and beam body 47 are mutually detachable, for example to permit repair of the tensioning frame if required. This form of brace plate 40 is particularly effective at preventing deformation of the beam body 47 which would act to close the opening 48, and also torsional deformation of the beam body 47.

It should be noted that the engagement surfaces 5 of adjacent engagement bodies 7 must be spaced apart, so that a strut 23 can be located in each gap between the two adjacent engagement surfaces 5. This may be achieved in various ways as will be apparent to those skilled in the art. In a first alternative, spacers (not shown) in the form of plates or discs for example may be provided between adjacent engagement bodies 7 whose thickness substantially corresponds to the width of a strut 23. The spacers would be slid into the beam body 47 intermediate each engagement body 7 during the assembly process. Since the engagement bodies will abut adjacent spacers, it is preferable for the spacers to be formed from a relatively low-friction material, such as a plastics material. In a second alternative, the engagement surface of each engagement body 7 may be made shorter than the remainder of the engagement body, so that, while the engagement bodies 7 themselves lie in abutting relationship within the beam body 47 when assembled, the engagement surfaces are spaced to permit a strut 23 to be located therebetween. Once all engagement bodies 7, and, optionally, spacers are slid into the beam body 47, the brace plate 40 may be snapped into place to form the beam 41, and the final tensioning frame is then constructed by attaching a plurality of beams 41 (with four beams to create a rectangular form being most suitable for modern printing processes) and connecting adjacent beams 41 with respective corner sections, such as those shown in FIG. 1.

FIGS. 5A-C show similar views to FIGS. 4A-C, with a modified form of brace plate 50 and extruded beam body 57. In this embodiment, the brace plate 50 comprises a main, planar body section 52, and first and second interfaces 53, 54 respectively located at opposite sides thereof. Interface 53 has the form of a downwardly projecting folded edge perpendicular to the plane of the body section 52. Interface 54 comprises an upwardly-pointing projection and a laterally outwardly extending projection forming an "L"-shape. The beam body 57 meanwhile is provided with complementary interfaces 55, 56, for engaging with interfaces 53, 54 respectively in use. Here, interfaces 55, 56 are formed as recesses in the extruded beam body 57, dimensioned to receive and accommodate interfaces 53, 54 in use. FIG. 5C schematically shows a cross-sectional view of a beam 51 including its brace plate 50 in a mounted state. This form of brace plate 50 is particularly effective at preventing deformation of the beam body 57 which would act to close the opening, and also torsional deformation of the beam body 57.

FIGS. 6A-C show similar views to FIGS. 5A-C, with a modified form of brace plate 60 and extruded beam body 69.

In this embodiment, the brace plate 60 comprises a main, planar body section 62, and first and second interfaces 63, 64 respectively located at opposite sides thereof. Interface 63 has the form of a downwardly projecting folded edge perpendicular to the plane of the body section 62. Interface 64 comprises an upwardly-pointing projection and a laterally outwardly extending projection forming an "L"-shape. In addition, a third interface 65, in the form of an upward projection from body section 62 is provided between interface 63 and aperture 22. The beam body 69 meanwhile is provided with complementary interfaces 66, 67 and 68, for engaging with interfaces 63, 64 and 65 respectively in use. Here, interfaces 66, 67 and 68 are formed as recesses in the beam body 69, dimensioned to receive and accommodate interfaces 63, 64, 65 in use. FIG. 6C schematically shows a cross-sectional view of a beam 61 including its brace plate 60 in a mounted state. This form of brace plate 60 is effective at preventing deformation of the beam body 69 which would act to either to close or widen the opening, and also torsional deformation of the beam body 69.

Figure 7A:
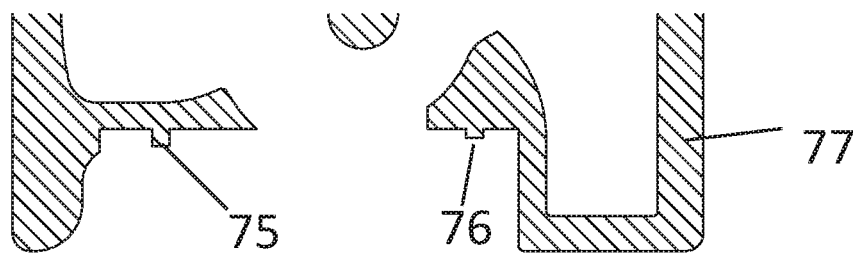
FIG. 7A schematically shows a cross-sectional view of a brace plate and a lower part of a beam in an unmounted state.
Figure 7B:
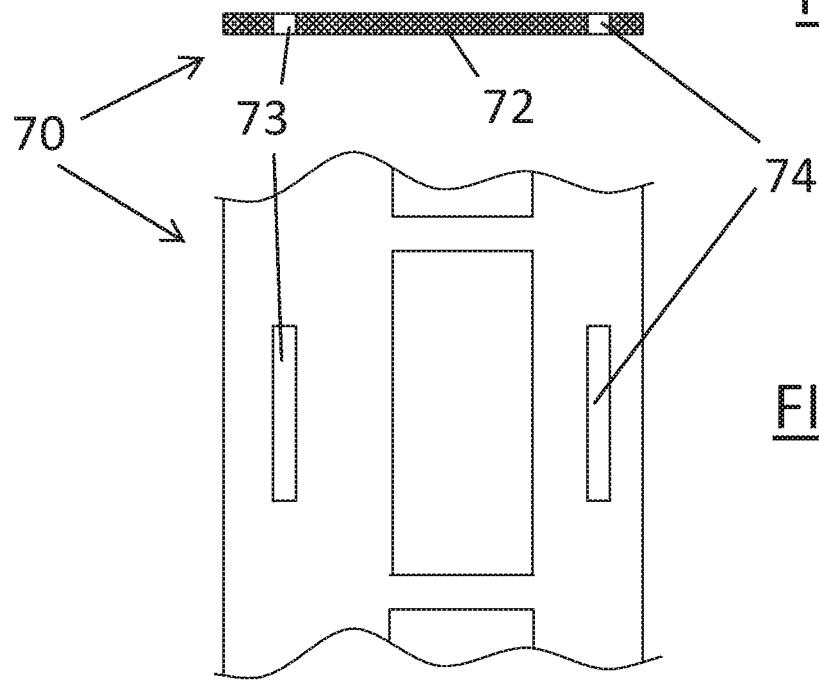
FIG. 7B schematically shows a part of the brace plate of FIG. 7A from below.
Figure 7C:
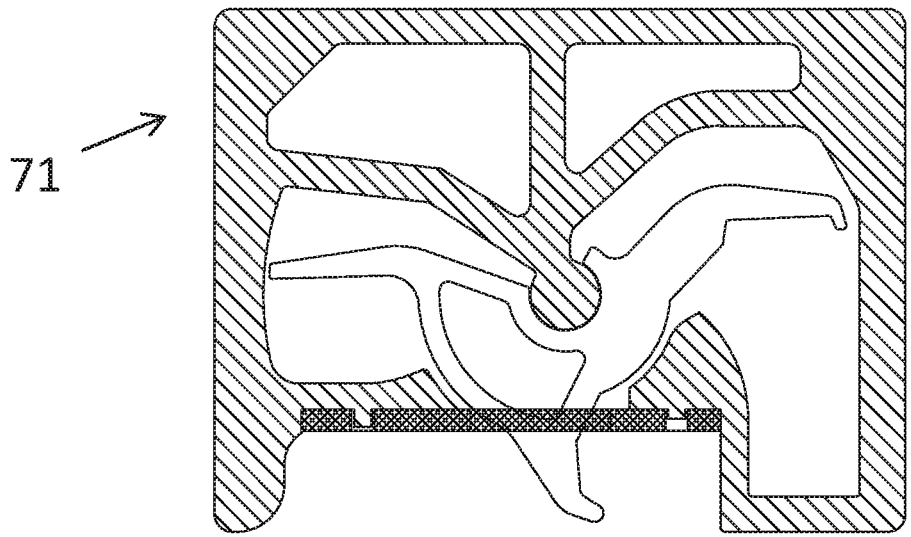
FIG. 7C schematically shows a cross-sectional view of the brace plate and beam of FIG. 7A when in a mounted state.

FIGS. 7A-C show similar views to FIGS. 4A-C, with a modified form of brace plate 70 and extruded beam body 77. In this embodiment, the brace plate 70 comprises a main, planar body section 72, and first and second interfaces 73, 74 respectively located at opposite sides thereof. Interfaces 73, 74 each has the form of a slot extending parallel to the length of the brace plate 70 formed within the body section 72. The beam body 77 meanwhile is provided with complementary interfaces 75, 76, for engaging with interfaces 73, 74 respectively in use. Here, interfaces 75, 76 are formed as downwardly-extending projections in the beam body 77, dimensioned to be received and accommodated within interfaces 73, 74 in use. FIG. 7C schematically shows a cross-sectional view of a beam 71 including its brace plate 70 in a mounted state. This form of brace plate 70 is effective at preventing deformation of the beam body 77 which would act to either to close or widen the opening, and also torsional deformation of the beam body 77.

Figure 8A:
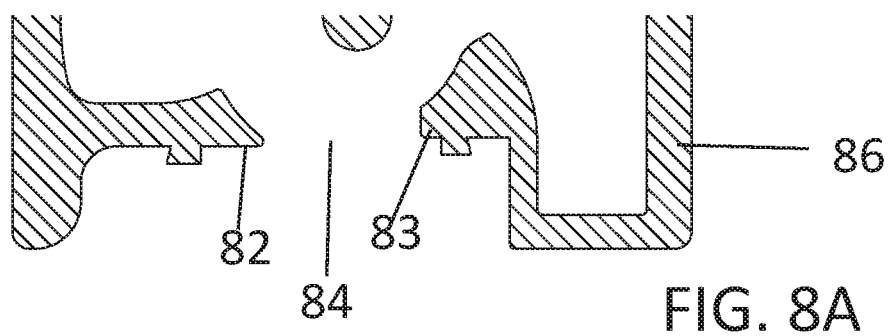
FIG. 8A schematically shows a cross-sectional view of a brace plate and a lower part of a beam in an unmounted state.
Figure 8B:
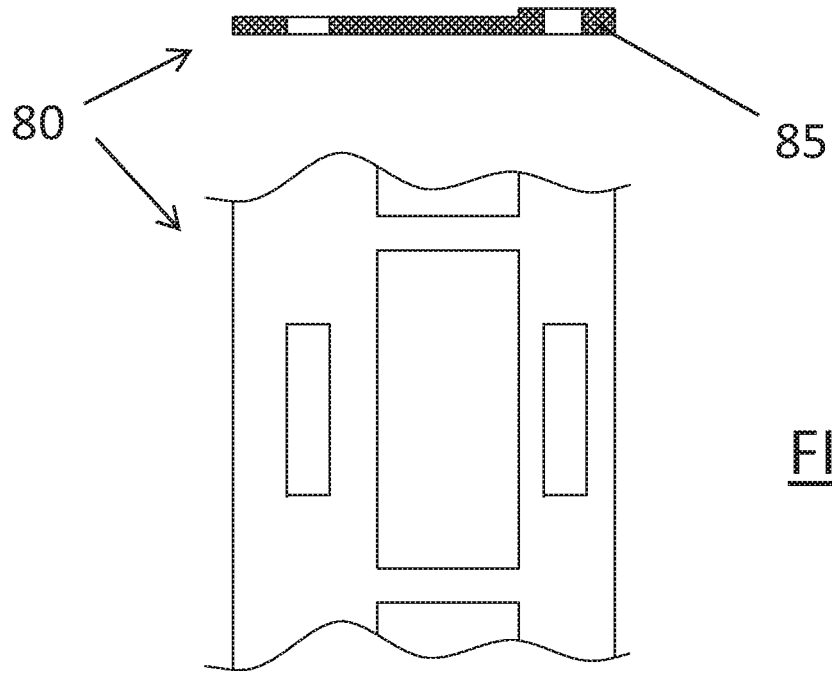
FIG. 8B schematically shows a part of the brace plate of FIG. 8A from below.
Figure 8C:
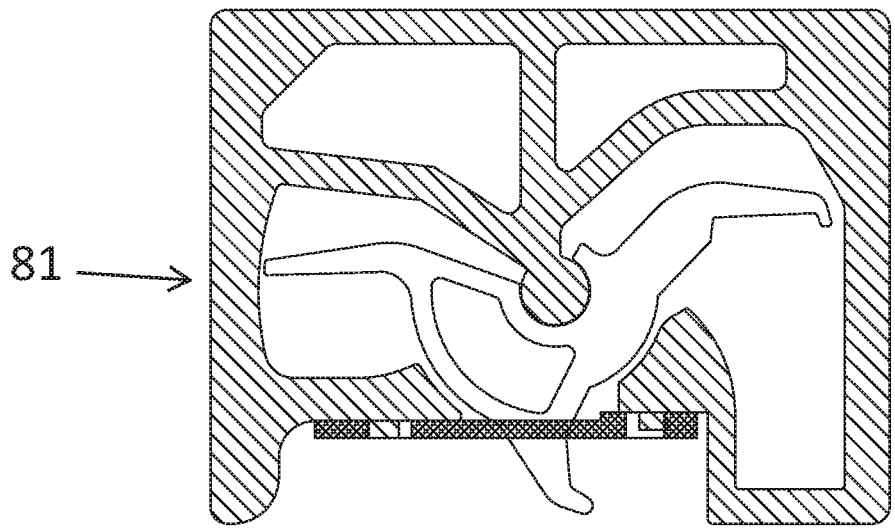
FIG. 8C schematically shows a cross-sectional view of the brace plate and beam of FIG. 8A when in a mounted state.

FIGS. 8A-C show similar views to FIGS. 7A-C, with a modified form of brace plate 80 and beam 81. In this embodiment, the extruded beam body 86 has portions 82 and 83 which define opening 84, and where portions 82 and 83 are not at the same height with respect to the engagement surface of beam 81. As shown, portion 83 is slightly higher than portion 82. To counter this height differential, interface 85 of brace plate 80 comprises a relatively thick region, which projects upwardly by a distance equal to the height differential of portions 82 and 83. FIG. 8C schematically shows a cross-sectional view of a beam 81 including its brace plate 80 in a mounted state. This form of brace plate 80 is effective at preventing deformation of the beam body 86 which would act to either to close or widen the opening 84, and also torsional deformation of the beam body 86.

Figure 9A:
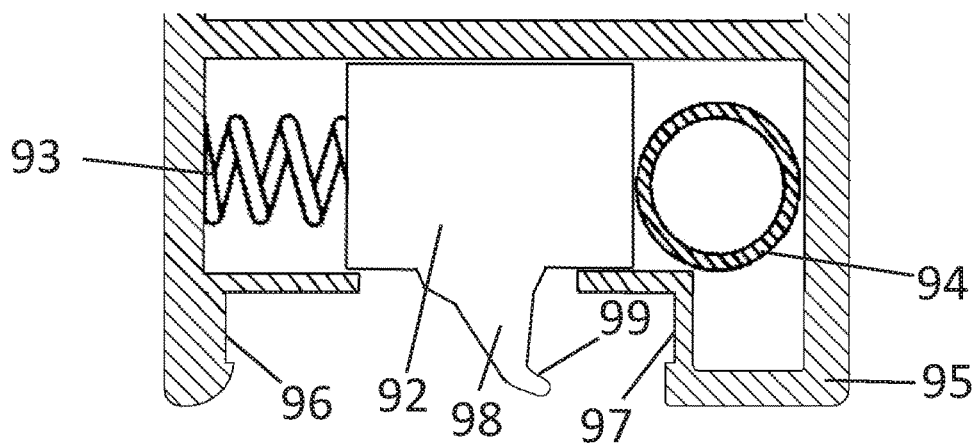
FIG. 9A schematically shows a cross-sectional view of a brace plate and a lower part of a beam in an unmounted state.
Figure 9B:
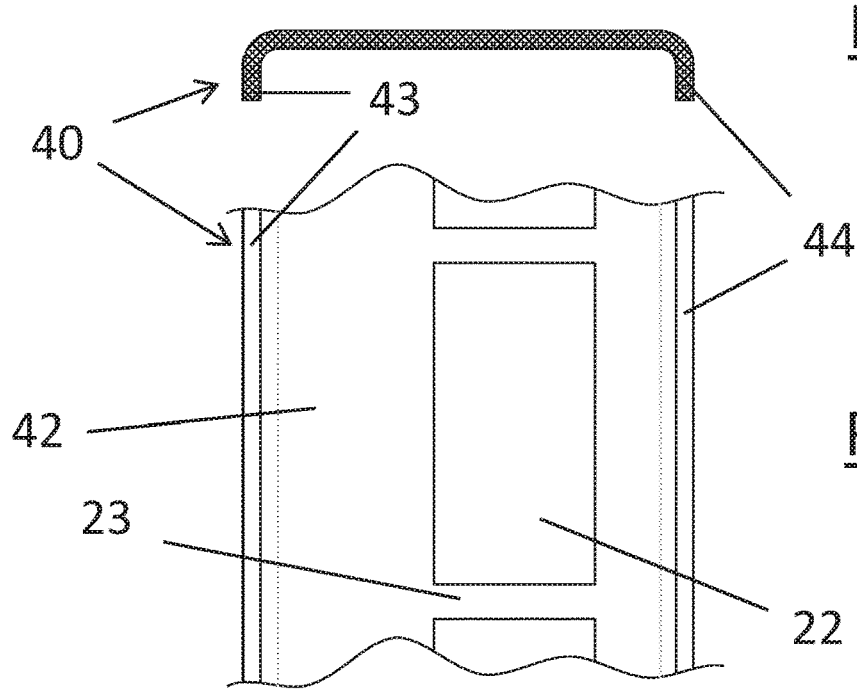
FIG. 9B schematically shows a part of the brace plate of FIG. 9A from below.
Figure 9C:
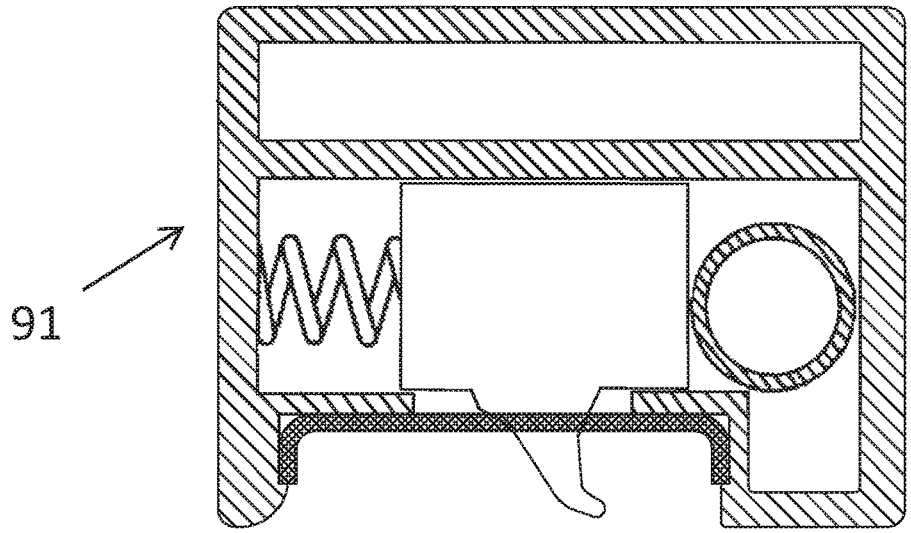
FIG. 9C schematically shows a cross-sectional view of the brace plate and beam of FIG. 9A when in a mounted state.

While the embodiments described with reference to FIGS. 4 to 8 all relate to rotary-style systems, where the engagement body is adapted for rotary motion in a similar manner as for the conventional Vectorguard system shown in FIGS. 1 and 2, the use of a brace plate is equally applicable to linear-style systems, in which linearly-movable engagement bodies are employed, which move linearly relative to a side of a tensioning frame within a beam. An exemplary embodiment is shown in FIGS. 9A-C, in which a brace plate substantially identical to that of FIGS. 4A-C is used. FIG. 4A schematically shows a cross-sectional view of a brace plate 40 and a lower part of an extruded beam body 95 in an unmounted state. The beam body 91 is shown in a highly schematic form, but comprises an engagement body 92 having a hook-like projection 98 carrying an engagement surface 99 at its underside. In practice, a plurality of individual engagement bodies may be located along the length of each beam 91 of the tensioning frame. The engagement body 92 is constrained for linear movement in the left-right direction as shown by a correspondingly sized guide space defined by extruded beam body 95. Located within the beam body 95, on respective sides of the engagement body 92 are a biasing means in the form of a spring 93 and a pneumatically-inflatable tubing 94, such that inflation of the tubing 94 will cause the engagement body 92, and hence engagement surface 99 to move to the left, while subsequent deflation of the tubing 94 will allow engagement body 92 to move to the right due to the biasing force applied by spring 93. The beam body 95 comprises first and second interfaces 96, 97, located on either side of an opening of a channel formed by the beam body 95. Here, interfaces 96, 97 are formed as recesses in the extruded beam body 95, dimensioned to receive and accommodate interfaces 43, 44 (see below) in use, so that the brace plate 40 covers the opening. FIG. 9B schematically shows a part of brace plate 40 from below, i.e. the side of the brace plate 40 which is visible from the outside when it is fitted to beam body 95. FIG. 9C schematically shows a cross-sectional view of a beam 91 including its brace plate 40 in a mounted state. In this embodiment, the brace plate 40 comprises a main, planar body section 42, and first and second interfaces 43, 44 respectively located at opposite sides thereof, in the form of downwardly projecting folded edges perpendicular to the plane of the body section 42, for engaging with complementary interfaces 96, 97 respectively in use. Apertures 22, separated by struts 23, permit the projection 98 and engagement surface 99 to protrude therethrough throughout its range of linear travel. Preferably, the brace plate 40 is capable of limited flexing, to ensure that the brace plate 40 and beam body 95 are mutually detachable, for example to permit repair of the tensioning frame if required. This form of brace plate 40 is particularly effective at preventing deformation of the beam body 95 which would act to close the opening, and also torsional deformation of the beam body 95.

In alternative embodiments (not shown), brace plates similar to those shown in FIGS. 5 to 8 may equally be used with such linear-style systems, by suitable provision of complementary interfaces on the brace plate and beam body.

In further embodiments, the beam body and brace plate may be reconfigured, so that brace plate comprises the entire engagement surface of the beam. FIGS. 10A-C and 11A-C illustrate such embodiments for rotational-style and linear-style engagement bodies respectively.

Figure 10A:
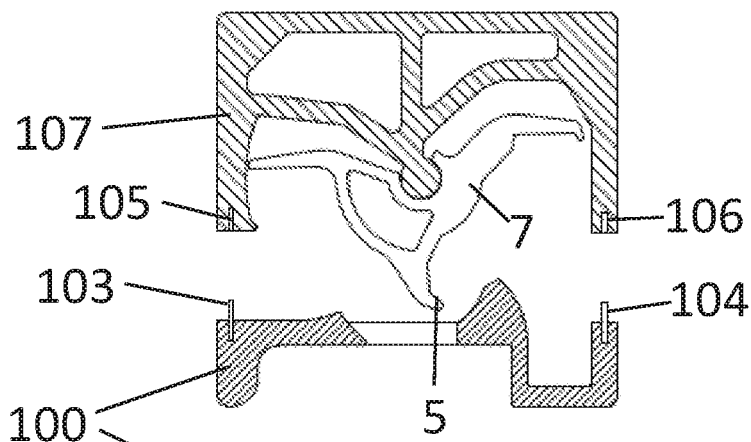
FIG. 10A schematically shows a cross-sectional view of a brace plate and a lower part of a beam in an unmounted state.
Figure 10B:
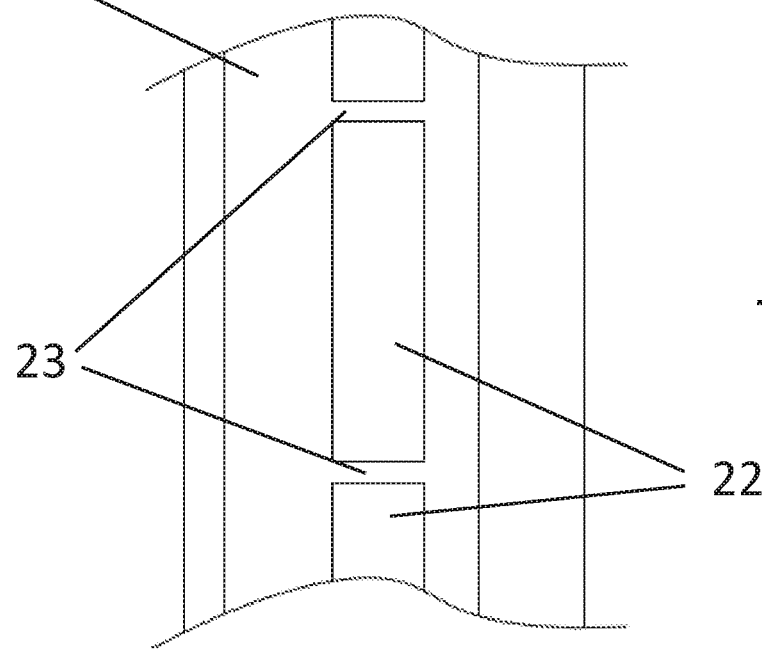
FIG. 10B schematically shows a part of the brace plate of FIG. 10A from below.
Figure 10C:
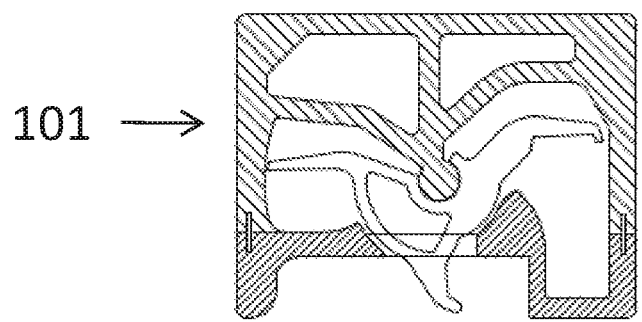
FIG. 10C schematically shows a cross-sectional view of the brace plate and beam of FIG. 10A when in a mounted state.

FIG. 10A schematically shows a cross-sectional view of a brace plate 100 and a lower part of an extruded beam body 107 of a beam 101 (see FIG. 10C) in an unmounted state. For clarity, internal components of the beam 101, such as the engagement bodies, are omitted from this figure. FIG. 10B schematically shows a part of brace plate 100 from below, i.e. the side of the brace plate 100 which is visible from the outside when it is fitted to beam body 107. FIG. 10C schematically shows a cross-sectional view of a beam 101 including its brace plate 100 in a mounted state. In this embodiment, the brace plate 100 takes as its profile the final profile of the engagement surface of beam 101. First and second interfaces 103, 104 are respectively located at opposite ends thereof, in the form of upwardly projecting dowels. The beam body 107 meanwhile is provided with complementary interfaces 105, 106, for engaging with interfaces 103, 104 respectively in use. Here, interfaces 105, 106 are formed as recesses in the beam body 107, dimensioned to receive and accommodate interfaces 103, 104 in use, so that the brace plate 100 covers the entirety of the lower, engagement, surface. Apertures 22, separated by struts 23, permit the engagement surface 5 of a respective engagement body 7 to protrude therethrough throughout its range of rotary travel. In this embodiment, the brace plate 100 does not need to have any flexing capability to ensure that the brace plate 100 and beam 101 are mutually detachable, and indeed it is preferred if the brace plate 100 is as rigid as possible, for maximum structural integrity.

Figure 11A:
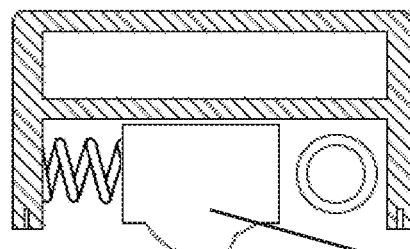
FIG. 11A schematically shows a cross-sectional view of a brace plate and a lower part of a beam in an unmounted state.
Figure 11B:
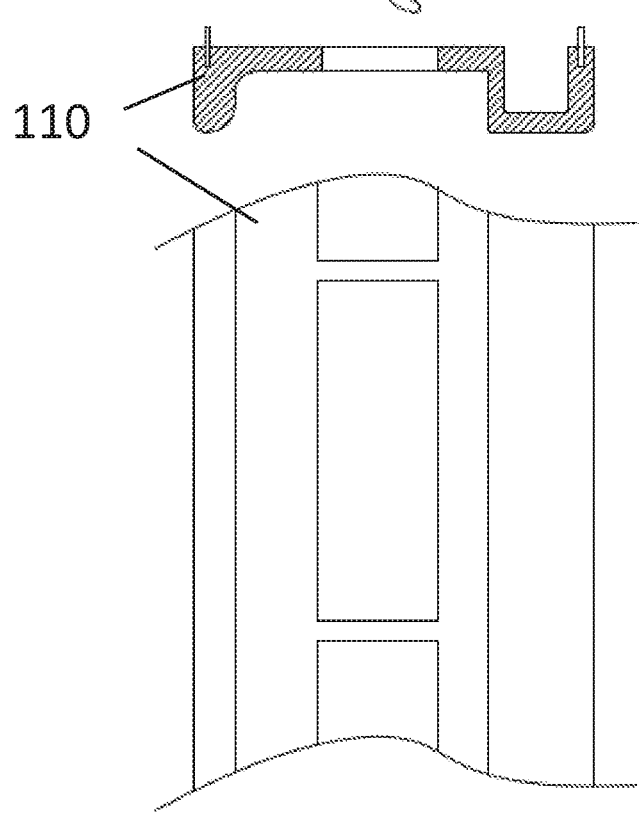
FIG. 11B schematically shows a part of the brace plate of FIG. 11A from below.
Figure 11C:
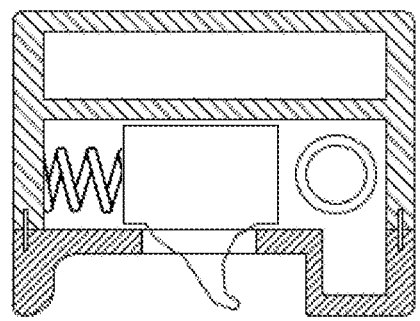
FIG. 11C schematically shows a cross-sectional view of the brace plate and beam of FIG. 11A when in a mounted state.

FIGS. 11A-C are similar to FIGS. 10A-C, except that here the engagement body 7 is of the linear-type. The general form of brace plate 110 is similar, and operationally identical, to the brace plate 100 of FIG. 10.

For both of the embodiments of FIGS. 10 and 11, the assembly process requires inserting engagement bodies 7, and actuation means into a beam body before attaching the brace plate. However, due to the enhanced space available at the base of the beam body (as opposed to that shown in FIG. 4A for example), the engagement bodies may be directly placed into position, rather than being slid into the beam body from an end thereof. For the rotary-style engagement body shown in FIG. 10, it may be possible in this case to snap-fit the engagement body onto its spindle.

As previously noted, in embodiments similar to those shown in FIGS. 4 to 11 the engagement surfaces of adjacent engagement bodies must be spaced apart, so that a strut can be located in each gap between the two adjacent engagement surfaces. This may be achieved in various ways as will be apparent to those skilled in the art. In a first alternative, spacers (not shown) in the form of plates or discs for example may be provided between adjacent engagement bodies whose thickness substantially corresponds to the width of a strut. The spacers would be slid (or optionally directly placed in the case of the embodiments shown in FIGS. 10 and 11) into the beam body intermediate each engagement body during the assembly process. Since the engagement bodies will abut adjacent spacers, it is preferable for the spacers to be formed from a relatively low-friction material, such as a plastics material. In a second alternative, the engagement surface of each engagement body may be made shorter than the remainder of the engagement body, so that, while the engagement bodies themselves lie in abutting relationship within the beam body when assembled, the engagement surfaces are spaced to permit a strut to be located therebetween. Once all engagement bodies, and, optionally, spacers are slid into the beam body, the brace plate may be snapped into place to form the beam, and the final tensioning frame is then constructed by attaching a plurality of beams (with four beams to create a rectangular form being most suitable for modern printing processes) and connecting adjacent beams with respective corner sections, such as those shown in FIG. 1. The engagement surfaces of adjacent engagement bodies aligned along the length of a beam will therefore form a discontinuous composite engagement surface extending along the beam, with gaps in this composite engagement surface corresponding at least to the width of the struts in the brace plate, i.e. each individual engagement surface is spaced apart by at least a width of a strut. Alternatively, a composite engagement surface which is substantially continuous along the length of the beam may be formed by extending the length of each individual engagement surface so that it is longer than a part of the engagement body located in the channel, so that adjacent engagement surfaces are in close proximity. One way in which this may be achieved (not shown) would be to use modular engagement bodies, in which an engagement member including an engagement surface may be detached from the main engagement body, allowing the brace plates to be fixed into place, and then the engagement member is attached to the engagement body.

Further embodiments of the present invention do not involve a brace plate, instead using a new configuration of beams and engagement bodies. Here again, such embodiments are equally applicable to both rotary-style and linear-style tensioning frames.

Figure 12:
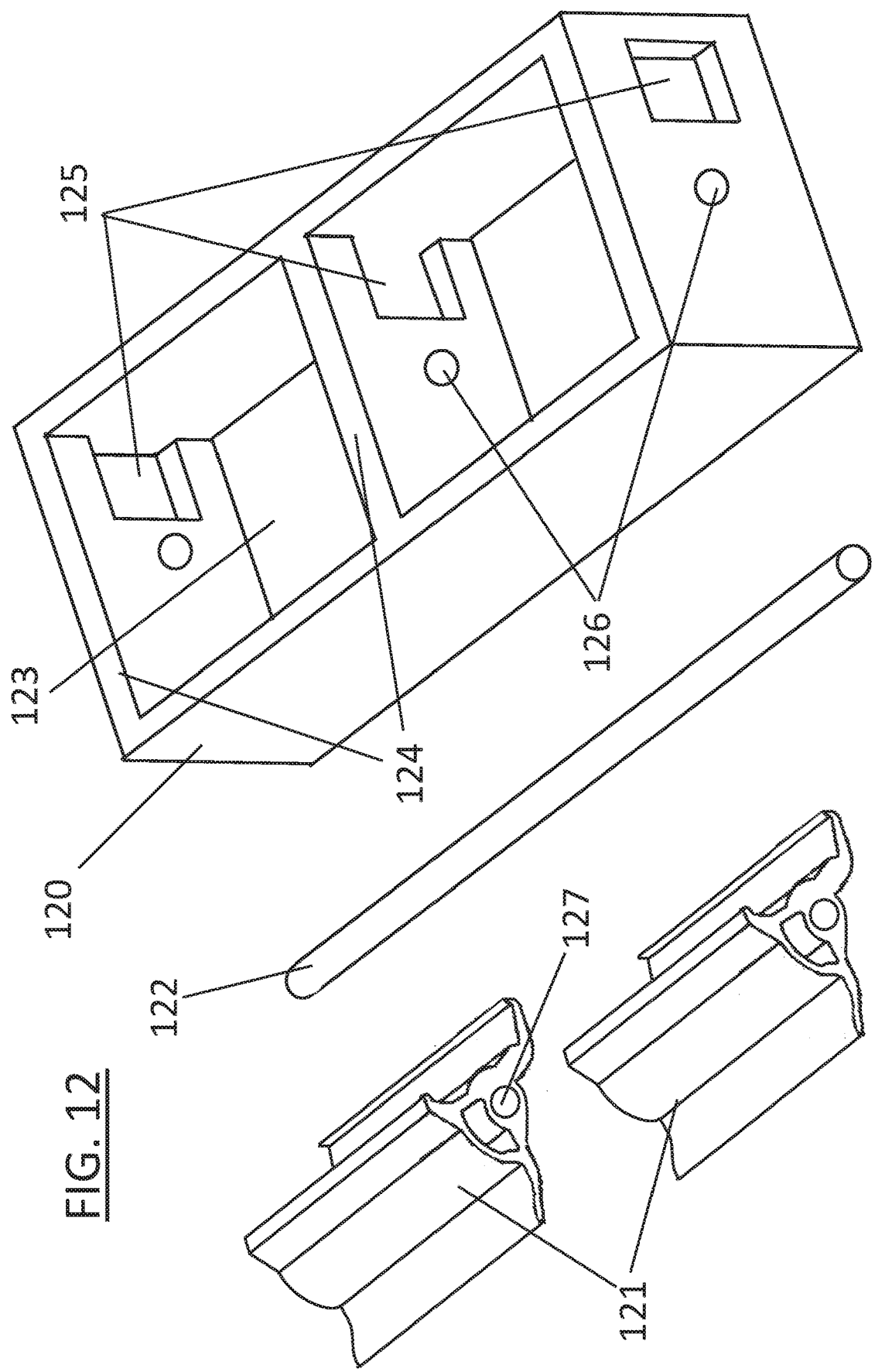
FIG. 12 schematically shows, in exploded perspective view, structural components of a beam in accordance with a further embodiment of the present invention.

FIG. 12 schematically shows, in exploded perspective view, structural components of a beam in accordance with a further embodiment of the present invention. The external dimensions of the beam are defined by a beam body 120 formed from a rigid material such as aluminium or steel or the like. Also shown are two rotary engagement bodies 121, and an elongate shaft 122 for securing the engagement bodies 121 within the beam body 120.

The beam body 120 has a linear array of hollow cavities or pockets 123 formed along its length, so that a discontinuous channel is formed within and along the length of the beam body 120 comprising the plurality of pockets 123. The pockets 123 may be formed for example by machining or milling. In the exemplary embodiment shown, the beam body 120 only includes two such pockets 123 for receiving respective engagement bodies 121 therein, but in practice beam bodies may include many more pockets 123, for example eight to twelve. Adjacent pockets 123 are separated by respective side walls 124 integrally formed with the beam body 120, and these side walls act as struts providing mechanical strengthening of the beam body structure. The pockets and engagement bodies are dimensioned so that each engagement body may be located within a respective pocket and able to rotate relative thereto, with an engagement surface of the engagement body projecting outwardly from the opening of the channel, during at least part of the engagement surface's range of travel, while travel of the engagement body along the length of the beam body 120 is constrained by adjacent side walls 124. Windows 125 are provided in each side wall 124, dimensioned to receive a pneumatically-inflatable tube (not shown), which extends along the length of the beam body 120 and which in use is inflatable to cause rotation of an adjacent engagement body 121. A wall hole 126 is provided in each side wall 124, arranged and dimensioned so that elongate shaft 122 may be received therein to run within the beam and parallel to its length. Each engagement body 121 is similarly provided with a through-bore 127 which extends therethrough along the engagement body's axis of rotation, and dimensioned to receive shaft 122 so that the axis of the shaft 122 acts as a rotation axis, with the engagement body being rotatably movable about the axis. In addition, each pocket 123 is dimensioned to receive a biasing means such as a spring, which in use acts on the engagement body 121 against the force exerted by inflation of the pneumatic-inflatable tube, so that the general actuation operation of the engagement body 121 is similar to that described above with reference to FIGS. 1 and 2.

To assemble the beam, each engagement body 121 is located or "dropped" into a respective pocket 123, and then shaft 122 is inserted into the beam body 120, through wall holes 126 and through-bores 127, so that the engagement bodies 121 are threaded on to the beam body 120, to retain each engagement body 121 within its respective pocket 123. Springs may be located within the pockets either before, after or simultaneously with the engagement body, depending on the desired location of the spring. The pneumatically-inflatable tube may be threaded through the windows 125 of the beam body before or after introduction of the engagement bodies 121. Corner pieces (not shown) which include pneumatic junctions operatively communicating with the pneumatically-inflatable tube may then be used to connect different beams together to form the tensioning frame.

There are various different ways of enabling rotation of the engagement bodies 121, for example:

i) the shaft 122 may be fixed relative to the beam body 120, for example by interference fit between the shaft 122 and the inner surface of wall holes 126, while the through-bores 127 are large enough to permit relative rotation of the engagement bodies 121 and shaft 122—optionally bearings or bushings may be provided around through-bores 127 to facilitate such rotation; or ii) the engagement bodies 121 are fixed relative to the shaft 122, for example by interference fit between the shaft 122 and the inner surface of through-bores 127, while the wall holes 126 are large enough to permit relative rotation of the shaft 122 and beam body 120—optionally bearings or bushings may be provided around wall holes 126 to facilitate such rotation. Optionally, keying features (not shown) may be provided on the shaft 122 to correctly align the engagement bodies 121 along the shaft 122.

Figure 13:
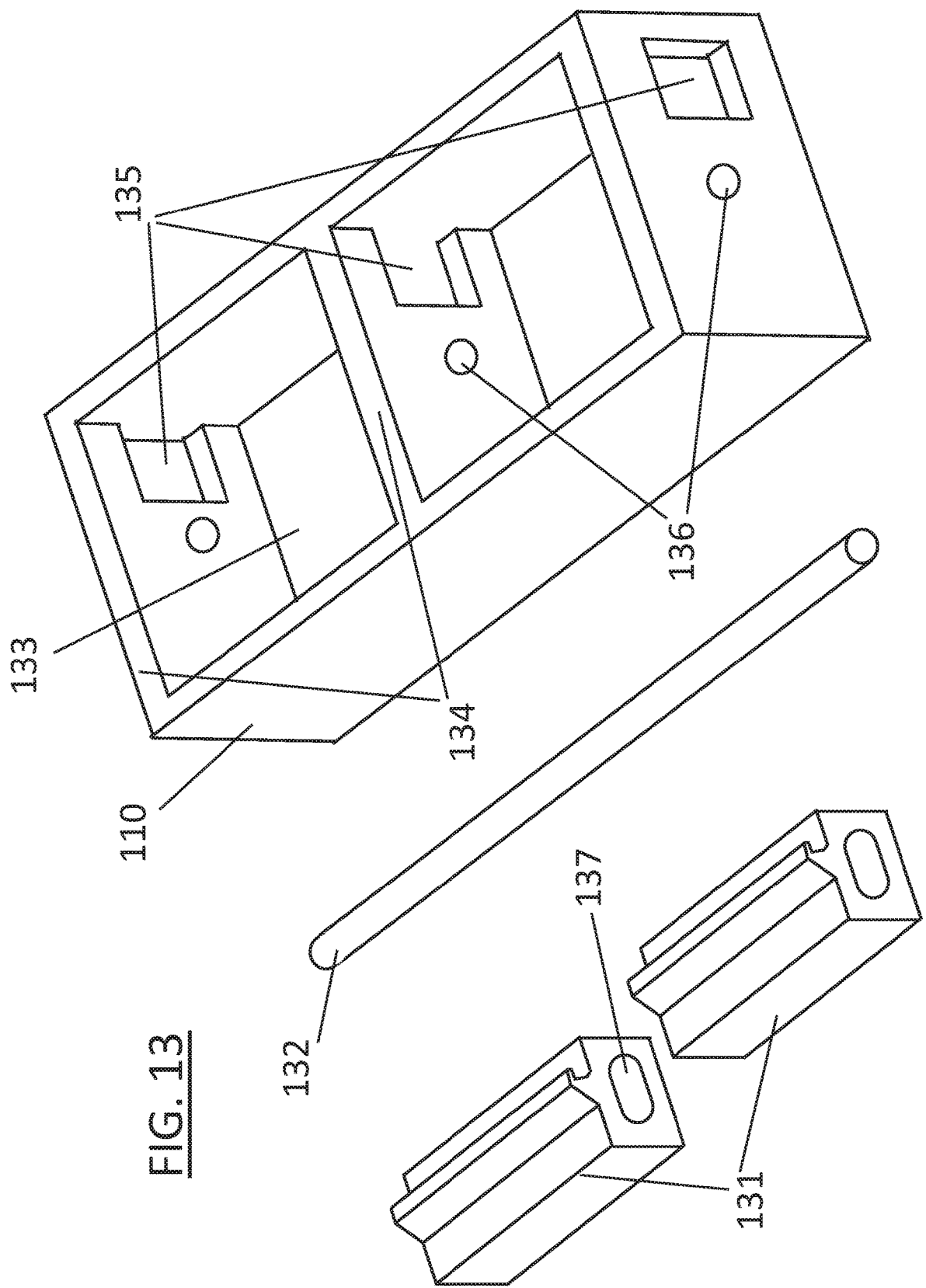
FIG. 13 schematically shows, in exploded perspective view, structural components of a beam in accordance with a yet further embodiment of the present invention.

FIG. 13 schematically shows, in exploded perspective view, structural components of a beam in accordance with a yet further embodiment of the present invention. The external dimensions of the beam are defined by a beam body 130 formed from a rigid material such as aluminium or steel or the like. Also shown are two linear engagement bodies 131, and an elongate shaft 132 for securing the engagement bodies 131 within the beam body 130.

Similarly to the embodiment shown in FIG. 12, the beam body 130 has a linear array of hollow cavities or pockets 133 formed along its length, so that a discontinuous channel is formed within and along the length of the beam body 130 comprising the plurality of pockets 133. The pockets 133 may be formed for example by machining or milling. In the exemplary embodiment shown, the beam body 130 only includes two such pockets 133 for receiving respective engagement bodies 131 therein, but in practice beam bodies may include many more pockets 133, for example eight to twelve. Adjacent pockets 133 are separated by respective side walls 134 integrally formed with the beam body 130, and these side walls act as struts providing mechanical strengthening of the beam body structure. The pockets and engagement bodies are dimensioned so that each engagement body may be located within a respective pocket and able to linearly move relative thereto parallel to the side walls 134, with an engagement surface of the engagement body projecting outwardly from the opening of the channel, during at least part of the engagement surface's range of travel, while travel of the engagement body along the length of the beam body 130 is constrained by adjacent side walls 134. Windows 135 are provided in each side wall 134, dimensioned to receive a pneumatically-inflatable tube (not shown), which extends along the length of the beam body 130 and which in use is inflatable to cause linear movement of an adjacent engagement body 131. A wall hole 136 is provided in each side wall 134, arranged and dimensioned so that elongate shaft 132 may be received therein to run within the beam and parallel to its length. Each engagement body 131 is provided with a through-bore 137 which extends therethrough, and dimensioned to receive shaft 132. The through-bore 137 is formed as an elongate slot, so that the engagement body 131 is linearly movable with respect to the shaft 132, the extent of such linear movement being constrained by the relative movement of the shaft 132 along the elongate slot. In addition, each pocket 133 is dimensioned to receive a biasing means such as a spring, which in use acts on the engagement body 131 against the force exerted by inflation of the pneumatic-inflatable tube, so that the general actuation operation of the engagement body 131 is similar to that described above with reference to FIG. 9.

To assemble the beam, each engagement body 131 is located or "dropped" into a respective pocket 133, and then shaft 132 is inserted into the beam body 130, through wall holes 136 and through-bores 137, so that the engagement bodies 131 are threaded on to the beam body 130, to retain each engagement body 131 within its respective pocket 133. Springs may be located within the pockets either before, after or simultaneously with the engagement body. The pneumatically-inflatable tube may be threaded through the windows 135 of the beam body before or after introduction of the engagement bodies 131. Corner pieces (not shown) which include pneumatic junctions operatively communicating with the pneumatically-inflatable tube may then be used to connect different beams together to form the tensioning frame.

Figure 14:
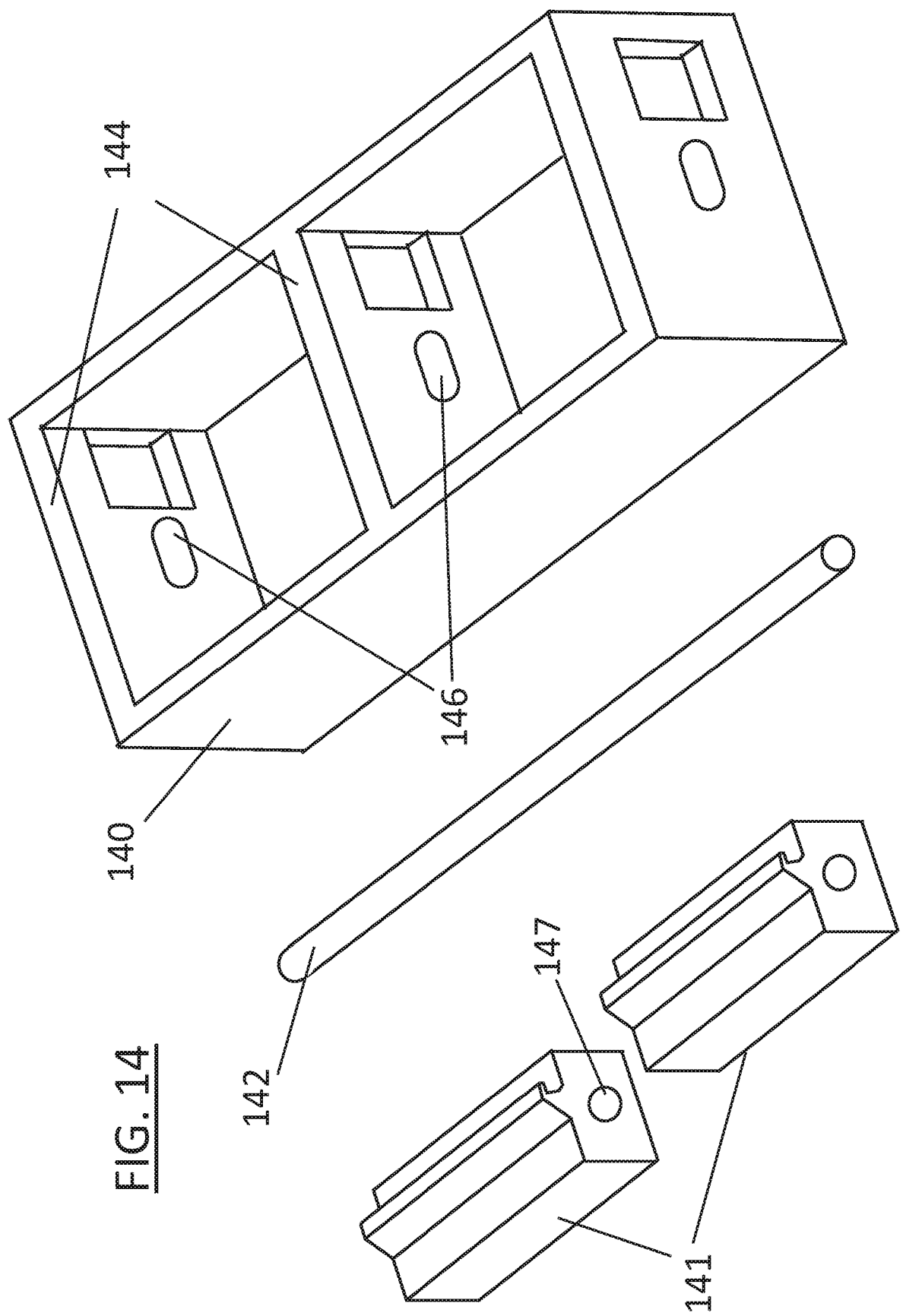
FIG. 14 schematically shows, in exploded perspective view, structural components of a beam in accordance with a further embodiment of the present invention.

FIG. 14 schematically shows, in exploded perspective view, structural components of a beam in accordance with a further embodiment of the present invention. This embodiment is essentially a modification of the embodiment shown in FIG. 13, and so for conciseness repeated detailed explanation of all components is omitted. A beam body 140 is similar to the beam body 130 of FIG. 13, except that wall holes 146 here take the form of elongated slots extending parallel to the side walls 144 and laterally with respect to the length of the beam body 140. The wall holes 146 are dimensioned so that elongate shaft may freely move along the length of the slot in use. Engagement bodies 141 are generally similar to bodies 131 of FIG. 13, except that the through-bores 147 here have a circular section, and are dimensioned to snugly accommodate elongate shaft 142 with an interference fit therebetween to prevent relative movement therebetween in use. It can be seen therefore that when assembled, the engagement bodies 141 and shaft 142 may linearly move as a unit relative to beam body 140, with the range of linear movement being constrained by the length of the slots of wall holes 146.

Although not necessary for structural integrity, a plate (not shown), similar in form to that shown in FIG. 3, may optionally may attached to the engagement surface of the beam to provide a cover and restrict access to the springs, engagement bodies and pneumatic tubing.

It should be noted that in embodiments similar to those shown in FIGS. 12 and 13, the engagement surfaces of adjacent engagement bodies aligned along the length of a beam will form a discontinuous composite engagement surface extending along the beam, with gaps in this composite engagement surface corresponding at least to the width of the struts formed in the beam body, i.e. each individual engagement surface is spaced apart by at least a width of a strut. Alternatively, a composite engagement surface which is substantially continuous along the length of the beam may be formed by extending the length of each individual engagement surface so that it is longer than a part of the engagement body located in the channel, so that adjacent engagement surfaces are in close proximity. Since the beam is assembled by "dropping" engagement bodies into respective pockets of the channel rather than sliding them into the channel (as in the embodiments of FIGS. 4 to 10), the provision of longer engagement surfaces does not affect the assembly process.

The above-described embodiments are exemplary only, and other possibilities and alternatives within the scope of the invention will be apparent to those skilled in the art. For example, other forms of actuator for the engagement bodies are equally possible. As a specific example, instead of using pneumatically-inflatable tubing, a pneumatic piston or cylinder could be used to drive the engagement body.

The forms of engagement body described herein are exemplary only, and may take many different forms while operating on similar principles.

It will be recognised that while preferably the struts would be provided on each beam of a tensioning frame, some measure of structural strengthening will be achieved if only one or some of the constituent beams are reinforced in this way.

REFERENCE NUMERALS USED

1—Tensioning frame
2A-D—Beams
3—Printing screen
4—Corner pieces
5—Engagement surfaces
6—Channel opening
7—Engagement body
8—First arm
9—Spring
10—Second arm
11—Pneumatically inflatable tubing
12—Third arm
13—Pneumatic port
14—Spindle
15—Foil/mesh
16—Edging
20, 40, 50, 60, 70, 80, 100, 110—Brace plate
21—Layer
22—Aperture
23—Strut
41, 51, 61, 71, 81, 91, 101—Beam
42, 52, 62, 72—Planar body section
43, 44, 53, 54, 63-65, 73, 74, 85, 103, 104—Brace plate interfaces
45, 46, 55, 56, 66-68, 75, 76, 82, 83, 96, 97, 105, 106—Beam body interfaces
47, 57, 69, 77, 86, 95, 107—Beam body
48, 84—Channel opening
92—Linear engagement body
93—Spring
94—Pneumatically-inflatable tubing
98—Projection
99—Engagement surface
120, 130, 140—Beam body
121, 131, 141—Engagement body
122, 132, 142—Shaft
123, 133—Pocket
124, 134, 144—Side wall
125, 135—Windows
126, 136, 146—Wall holes
127, 137, 147—Through-bore

The invention claimed is:

1. A tensioning frame for tensioning a printing screen, the tensioning frame being planar and comprising a plurality of elongate beams which extend around the periphery of the tensioning frame to define the tensioning frame, each beam comprising:

an engagement side arranged such that the engagement side of each beam is co-planar and orientated parallel to the plane of the tensioning frame,
a beam body,
an elongate channel formed within the beam body which extends parallel to the length of the beam and has an opening at the engagement side,
an engagement body located within the channel carrying an engagement surface for engaging with a printing screen in use, the engagement surface being movable with respect to the beam body along a range of travel in a plane normal to the length of the beam, and
an actuator operatively connected to the engagement body for moving the engagement body, and hence engagement surface, relative to the beam body,
wherein at least one beam comprises at least one strut which spans the elongate channel, so that the engagement surface projects outwardly of the beam from the opening of the elongate channel and beyond the strut, during at least part of the engagement surface's range of travel.

2. The tensioning frame of claim 1, comprising a brace plate adapted to fit to the beam body adjacent the opening of the elongate channel, the brace plate comprising an aperture sized to receive the engagement surface, and wherein the strut is formed within the brace plate to delimit the aperture.

3. The tensioning frame of claim 2, wherein the brace plate comprises first and second interfaces respectively located at opposite sides thereof, which in use engage with respective features located on the beam body at opposite sides of the channel opening.

4. The tensioning frame of claim 2, wherein the brace plate and beam body are mutually detachable.

5. The tensioning frame of claim 1, wherein the engagement body is rotatably movable with respect to the beam body, about an axis arranged parallel to the length of the beam.

6. The tensioning frame of claim 1, wherein the engagement body is linearly movable with respect to the beam body.

7. The tensioning frame of claim 1, wherein the elongate channel is discontinuous along the length of the beam to form a plurality of pockets separated by respective walls, the engagement body being located within a pocket, and wherein the strut comprises one such wall separating adjacent pockets.

8. The tensioning frame of claim 7, comprising an elongate shaft which runs within the beam and parallel to its length through holes located in the beam body, and through a through-bore formed in the engagement body, such that the engagement body is retained within the pocket.

9. The tensioning frame of claim 8, wherein the elongate shaft has an axis and the engagement body is rotatably movable about the axis.

10. The tensioning frame of claim 8, wherein the through-bore is formed as an elongate slot, and wherein the engagement body is linearly movable with respect to the shaft, the extent of such linear movement being constrained by the relative movement of the shaft along the elongate slot.

11. The tensioning frame of claim 1, comprising at least one additional engagement body carrying a respective engagement surface, such that the engagement surfaces of each engagement body form a composite engagement surface extending along the beam.

12. The tensioning frame of claim 11, wherein each engagement surface is spaced apart by at least a width of a strut, such that the composite engagement surface is discontinuous.

13. The tensioning frame of claim 11, wherein each engagement surface is longer than a part of the engagement body located in the elongate channel, such that the composite engagement surface is substantially continuous along the length of the beam.

14. The tensioning frame of claim 1, wherein adjacent beams are connected by corner sections.

15. A tensioning frame for tensioning a printing screen, the tensioning frame being planar and comprising a plurality of elongate beams which extend around the periphery of the tensioning frame to define the tensioning frame, each beam comprising:
an engagement side arranged such that the engagement side of each beam is co-planar and orientated parallel to the plane of the tensioning frame,
a beam body,
an elongate channel formed within the beam body which extends parallel to the length of the respective beam and has an opening at the engagement side,
an engagement body located within the channel carrying an engagement surface for engaging with a printing screen in use, the engagement surface being movable with respect to the beam body along a range of travel in a plane normal to the length of the beam, and
an actuator operatively connected to the engagement body for moving the engagement body, and hence engagement surface, relative to the beam body,
wherein the engagement body comprises a through-bore, and the beam comprises an elongate shaft which passes through both the beam body and the through-bore of the engagement body, to retain the engagement body within the elongate channel.

16. The tensioning frame of claim 15, wherein the elongate shaft runs within the beam and parallel to its length through holes located in the beam body.

17. The tensioning frame of claim 15, wherein the elongate channel is discontinuous along the length of the beam to form a plurality of pockets separated by respective walls, the engagement body being located within a pocket; optionally the tensioning frame comprises at least one additional engagement body located in a respective pocket, each engagement body carrying a respective engagement surface, such that the engagement surfaces of each engagement body form a composite engagement surface extending along the beam.

18. The tensioning frame of claim 15, wherein the elongate shaft has an axis and the engagement body is rotatably movable about the axis.

19. The tensioning frame of claim 15, wherein the through-bore is formed as an elongate slot, and wherein the engagement body is linearly movable with respect to the shaft, the extent of such linear movement being constrained by the relative movement of the shaft along the elongate slot.

20. The tensioning frame of claim 15, wherein the holes are formed as elongate slots, and wherein the engagement body is linearly movable with respect to the beam body, the extent of such linear movement being constrained by the relative movement of the shaft along the elongate slots.

* * * * *